United States Patent [19]

Kondo et al.

[11] Patent Number: 5,191,402
[45] Date of Patent: *Mar. 2, 1993

[54] SEMICONDUCTOR DEVICE HAVING AN INTER-LAYER INSULATING FILM DISPOSED BETWEEN TWO WIRING LAYERS

[75] Inventors: Toshihiko Kondo; Kazuo Tanaka; Hirofumi Yasuda, all of Suwa, Japan

[73] Assignee: Seiko Epson Corporation, Nagano, Japan

[*] Notice: The portion of the term of this patent subsequent to Dec. 24, 2008 has been disclaimed.

[21] Appl. No.: 531,672

[22] Filed: Jun. 1, 1990

Related U.S. Application Data

[63] Continuation-in-part of Ser. No. 360,611, Jun. 2, 1989, Pat. No. 4,931,996, which is a continuation of Ser. No. 114,311, Oct. 27, 1987, abandoned, which is a continuation-in-part of Ser. No. 202,649, Jun. 7, 1989, Pat. No. 5,075,762.

[30] Foreign Application Priority Data

| Oct. 27, 1986 | [JP] | Japan | 61-164538 |
| Jun. 9, 1987 | [JP] | Japan | 62-143717 |
| Jun. 12, 1987 | [JP] | Japan | 62-145297 |
| Jun. 30, 1987 | [JP] | Japan | 62-163497 |
| Nov. 4, 1987 | [JP] | Japan | 62-278566 |
| Feb. 24, 1988 | [JP] | Japan | 63-41253 |

[51] Int. Cl.$^5$ ............ H01L 29/94; H01L 23/54; H01L 29/78
[52] U.S. Cl. .................. 257/288; 257/750; 257/758
[58] Field of Search ............. 357/23.14, 59 J, 59 G, 357/71, 68, 23.3, 23.14, 23.6, 52, 54, 59, 23.1, 23.5

[56] References Cited

U.S. PATENT DOCUMENTS

| 4,301,518 | 11/1981 | Klaas | 365/185 |
| 4,494,301 | 1/1985 | Faraone | 357/59 J |
| 4,532,534 | 7/1985 | Ford et al. | 357/23.14 |
| 4,654,680 | 3/1987 | Yamazaki | 357/23.3 |
| 4,663,645 | 5/1987 | Komori et al. | 357/23.3 |
| 4,807,002 | 2/1989 | Donzelli | 357/23.1 |
| 4,808,544 | 2/1989 | Matsui | 357/23.3 |
| 4,823,172 | 4/1989 | Mihara | 357/13 |
| 4,845,544 | 7/1989 | Shimizu | 357/23.6 |
| 4,855,801 | 8/1989 | Kuesters | 357/23.5 |
| 4,862,233 | 8/1989 | Matsushita et al. | 357/52 |
| 4,881,107 | 11/1989 | Matsushita | 357/52 |
| 4,907,046 | 3/1990 | Ohji et al. | 357/23.6 |
| 5,075,762 | 12/1991 | Kondo et al. | 357/68 |

OTHER PUBLICATIONS

"Use of Polysilicon Gate Layer for Local Interconnect in CMOS Technology Incorporating LDD Structures" El-Divany et al—IEEE Transactions on Electron Devices, vol. 35, No. 9, Sep. 1988, pp. 1556-1558.

"An 90ns 1Mb ROM" by Fujio Masuoka, et al., 1984 IEEE International Solid-Sate Circuits Conference, pp. 146, 147 and 329.

"4M Bit Mask ROM and The Application Therefore", by Shoichi-Tsujita Electronic Parts and Materials, published Jan. 1, 1986, pp. 104-108.

Primary Examiner—William Mintel
Assistant Examiner—S. V. Clark
Attorney, Agent, or Firm—Blum Kaplan

[57] ABSTRACT

A semiconductor device includes a substrate, first insulating film carried on the substrate, first wiring layer carried on the first insulating film and an interlayer insulating film overlying the first wiring layer and first insulating film. The interlayer insulating film has a top portion overlying the first wiring layer and a pair of sidewall portions. The sidewall portions of the interlayer insulating film overlie the first insulating film and the sides of the first wiring layer. The sidewall portions have progressively increasing width in progressing towards the substrate. The device also includes a second wiring layer which extends from overlying part of the top portion of the interlayer insulating film to and in contact with an exposed portion of the substrate adjacent to the first insulating film.

16 Claims, 9 Drawing Sheets

SEMICONDUCTOR DEVICE HAVING AN INTER-LAYER INSULATING FILM DISPOSED BETWEEN TWO WIRING LAYERS

CROSS-REFERENCE TO RELATED APPLICATIONS

This application is a continuation-in-part of U.S. patent application Ser. No. 07/360,611, filed Jun. 2, 1989, which issued as U.S. Pat. No. 4,931,996 on Jun. 5, 1990, which is a continuation of U.S. patent application Ser. No. 07/114,311, filed Oct. 27, 1987, now abandoned, and a continuation-in-part of U.S. patent application Ser. No. 07/202,649, filed Jun. 7, 1989, which issued as U.S. Pat. No. 5,075,762.

BACKGROUND OF THE INVENTION

The present invention relates to a semiconductor device and, more particularly, to metal-oxide-silicon (MOS) and metal insulator-silicon (MIS) semiconductor devices having an LDD (lightly doped drain) structure and a method of manufacturing such a semiconductor device.

Figure 1:
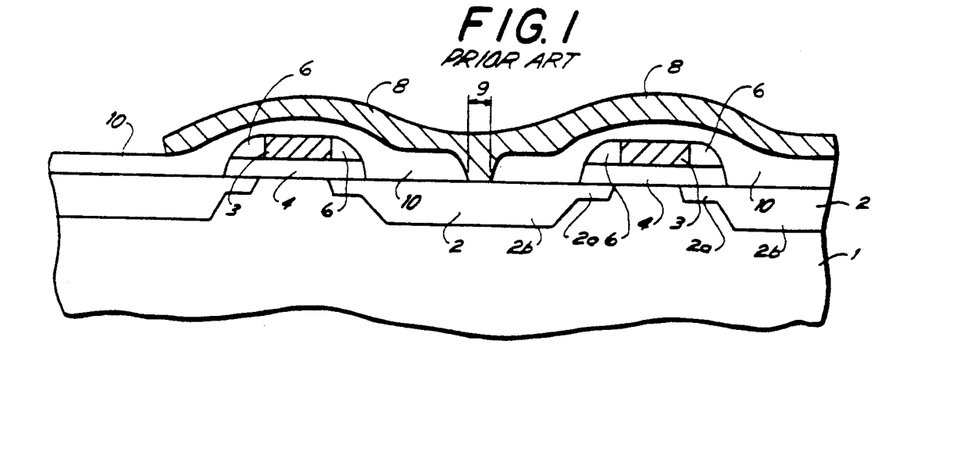
FIG. 1 is a sectional view of the structure of a conventional semiconductor device.
Figure 2:
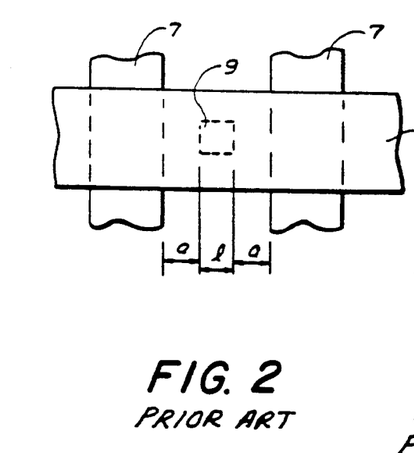
FIG. 2 is a plan view of the contact portion of the conventional semiconductor device shown in FIG. 1.

The structure of a conventional MOS semiconductor device and the contact portion thereof are shown in FIGS. 1 and 2, respectively, and the manufacturing process for a semiconductor device having an LDD structure is shown in FIGS. 3(a) to 3(e).

In these drawings, the MOS semiconductor device depicted includes a silicon (Si) substrate 1 having a surface-adjacent diffusion layer 2 formed therein. The layer 2 constitutes a source region or a drain region. The diffusion layer 2 is formed to a low-concentration region 2a and a high-concentration region 2b. Overlying the substrate 1 is a gate insulating film 4 and thereabove a gate electrode 3. Also depicted are an interlayer insulating film which generally overcovers the components lying thereunder, namely side wall 6 and a first wiring layer 7 (FIG. 2), the gate electrode 3, and the underlying gate insulating film 4. A second wiring layer 8 overlies the interlayer insulating film 10 the second wiring layer 8, through an opening 9 in the interlayer insulating film 10 penetrates to and contacts the major surface of the semiconductor substrate 1 at the diffusion layer region 2 thereof. The side wall 6 is formed on either side of gate electrode 3 on gate insulating film 4. The gate insulating film 4 is supported on the substrate 1 in such manner that the gate electrode 3 overspans diffusion layers 2.

By an LDD structure, generally speaking, is meant a structure in which the diffusion layer 2 is composed of a region 2a having a low concentration and a region 2b having a high concentration, as shown in FIG. 1. The low concentration of the region 2a prevents the diffusion layer 2 from extending to the region in which a channel is to be formed, namely, to the portion under the gate insulating film 4, thereby definitively establishing the channel length.

The LDD structure, in which the region 2a increases the resistance of the portion under the gate insulating film 4, relaxes the electric field produced in the vicinity of the drain, thereby suppressing the deterioration of the characteristics of the metal insulator semiconductor field effect transistor (hereinunder referred to as "MISFET"). Specifically, a certain fluctuation in threshold value is suppressed. That fluctuation occurs when carriers are injected and captured in the gate insulating film 4; in other words, the so-called hot carrier phenomenon is suppressed. A conventional manufacturing process for a semiconductor device having an LDD structure will now be described with reference to FIGS. 3(a) to 3(e).

Figure 3A:
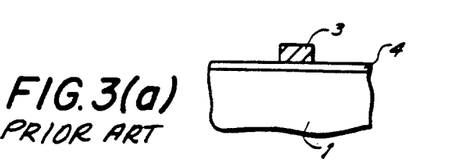
FIGS. 3(a) to 3(e) are explanatory views of a conventional manufacturing process of a semiconductor having an LDD structure.
Figure 3B:
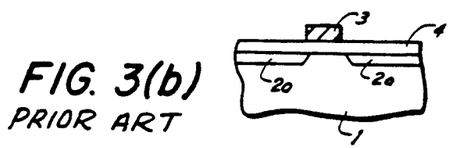
Figure 3C:
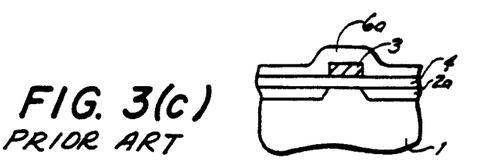
Figure 3D:
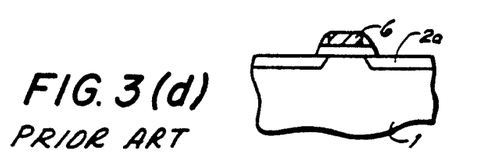
Figure 3E:
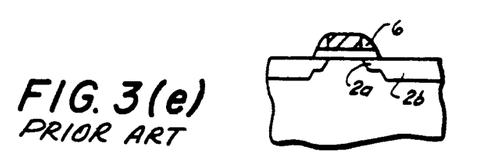

As shown in FIG. 3(a), a gate insulating film layer 4 is first formed on the substrate 1 by a conventional method. Then the gate electrode 3 is formed on the gate insulating film 4 by a conventional method. The diffusion layer 2a having a low concentration is next formed, as shown in FIG. 3(b). Then, as shown in FIG. 3(c), the interlayer insulating film 6a is formed. The side wall 6 is to be defined from the interlayer insulating film 6a. Next, as shown in FIG. 3(d), the side wall 6 is formed by anisotropic etching of the interlayer insulating film 6a. Finally, the diffusion layer 2b having a high concentration is formed, as shown in FIG. 3(e).

Such an LDD structure increases, and in this sense improves, the breakdown voltage which the semiconductor structure should withstand. Another advantageous effect is reduction in the above discussed fluctuation of the threshold value. The reduction is significant, so that the reliability of the transistor is greatly improved.

Japanese Patent Laid-Open No. 68776 (1976) discloses a MISFET having one conductivity type of source region and drain region formed on a semiconductor substrate of the opposite conductivity type. The drain region consists of a central portion having a high surface impurity concentration, and of a low impurity concentration portion which surrounds the central portion. That is, this MISFET adopts a double drain structure in order to relax the electric field produced in the vicinity of the drain region and to prevent the fluctuation of the threshold value due to the hot carrier phenomenon.

Japanese Patent Laid-Open No. 194568 (1985) discloses an integrated circuit (IC) provided with a MISFET which is capable of definitively establishing the effective channel length of the MISFET, thereby preventing the so-called short channel effect. In this manner, the degree of integration of the IC is improved, and the speed of the operation time is increased. For these purposes, the IC is composed of a semiconductor substrate which contains the impurities for constituting the drain region and the source region, respectively. These regions consist of two semiconductor regions of the same conductivity type but having different impurity densities. The impurities are introduced through the gate electrode and the side wall provided on both sides thereof as a mask. This prevents extension of the source region or the drain region to that region in which a channel is to be formed thus and definitively establishes the effective channel length.

Japanese Patent Laid-Open No. 20369 (1986) discloses a method of forming an LDD type semiconductor device. This method comprises the following steps. A gate insulating film is formed on a semiconductor substrate surrounded by a device isolation device region, and a gate electrode is formed on the gate insulating film. Then there is formed a first impurity layer of the second conductivity type by introducing impurities to the substrate while using the gate electrode as a mask. An insulating film is deposited on the entire surface; portions of the insulating film are removed by reactive ion etching but in such a manner as to retain the film on the side surface of the gate electrode and in the vicinity thereof. A second impurity layer of the second conductivity type is formed by introducing impurities to the substrate while using the gate electrode and the remaining insulating film as a mask so as to form source and drain region. A mask material layer is formed so as to have a selective etching property with respect to the insulating film on the entire surface. The mask material layer is selectively removed until a part of the remaining insulating film on the side surface of the gate electrode is exposed. The remaining insulating film is selectively removed by using the remaining mask material layer so as to form a gap portion between the insulating film and the gate electrode. Impurities are introduced to the substrate from the gap so as to form a third impurity layer of the first conductivity type (e.g. a P type layer).

The purpose for partially forming the third impurity layer of the first conductivity type is to suppress an extension of the depletion layer. That extension would otherwise be induced by the drain voltage in that region of the substrate which is of the first conductivity type and is in the vicinity of the side wall of the gate electrode. As a result the contact portion of the $P^-$ type layer which contains the source and drain regions is reduced in comparison with still earlier prior art.

The above-described conventional MOS semiconductor devices, however, have the following problems and shortcomings.

(1) As shown in FIG. 2, the contact portion between the wiring layer 8 and diffusion layer 2 constitutes a hole-like opening portion of length 1. Typically in the prior art, an alignment allowance a for photolithography is necessary in order to prevent short circuiting of the first wiring layer 7 and the second wiring layer 8 through the opening portion 9. Since the alignment allowance a is determined by the performance of an exposing device, it cannot be simply reduced. Thus, this is an obstacle to large scale integration.

(2) For a similar reason to that of (1), the alignment allowance a adds to the length of the second wiring layer 8; the additional length introduces resistance which delays propagation and makes speed-up of the operation well-nigh impossible.

(3) For a similar reason to that of (1), the alignment allowance a adds to the parasitic diffusion capacitance, thereby making speed-up of the operation well-nigh impossible.

Accordingly, there is a need to speed-up the operation of the semiconductor device by reducing wiring layer resistances and parasitic diffusion capacitance, to provide manufacturing methods which will assure achievement of such reductions in resistance and capacitance and to provide a relatively small IC chip area.

SUMMARY OF THE INVENTION

Generally speaking, in accordance with the invention, a semiconductor device includes a semiconductor substrate, a first insulating film carried on the semiconductor substrate, a first wiring layer having sides and carried on the first insulating film and an interlayer insulating film overlying the first wiring layer and the first insulating film.

The interlayer insulating film includes a top portion which overlies the first wiring layer and a pair of sidewall portions which overlie both the first insulating film and the sides of the first wiring layer. The pair of sidewall portions of the interlayer insulating film progressively increase in width progressing towards the substrate.

The semiconductor device also includes a second wiring layer which extends from overlying the top portion of the interlayer insulating film to and in contact with an exposed portion of the substrate adjacent to the first insulating film.

Preferably, the first and second wiring layers comprise layers of polycrystalline silicon. The semiconductor device also includes diffusion layer regions in the surface of the semiconductor substrate contacted by the first insulating film and defining a source region and a drain region.

Accordingly, it is an object of the present invention to provide a semiconductor device which eliminates the above-described problems in the prior art and a method of manufacturing such a semiconductor device.

It is another object of the present invention to prevent an alignment deviation between the first wiring layer 7 (gate electrode 3) and the opening portion 9, which would otherwise be produced by photolithography, and would bring about increase in contact resistance.

It is still another object of the invention to virtually eliminate the requirement for alignment allowance.

It is yet another object of the present invention to minimize the width of the wiring interval.

It is still a further object of the invention to restrict the width of the wiring interval to that required by fabrication necessity.

The above and other objects, features and advantages of the present invention will become clear from the following description of the preferred embodiments thereof, taken in conjunction with the accompanying drawings.

The invention accordingly comprises the several steps and a relation of one or more such step with respect to each of the others, and the device embodying features of construction, a combination of elements, and arrangement of parts which are adapted to effect such steps, all is exemplified in the following detailed disclosure and the scope of the invention will be indicated in the claims.

BRIEF DESCRIPTION OF THE DRAWINGS

For a fuller understanding of the invention, reference is had to the following description taken in connection with the accompanying drawings in which.

DESCRIPTION OF THE PREFERRED EMBODIMENTS

Embodiments of a semiconductor device according to the present invention will now be explained with reference to the accompanying drawings.

FIRST EMBODIMENT

An example of an embodiment of a semiconductor device according to the present invention which is applied to an IC provided with an N channel type MISFET will be explained.

Figure 4:
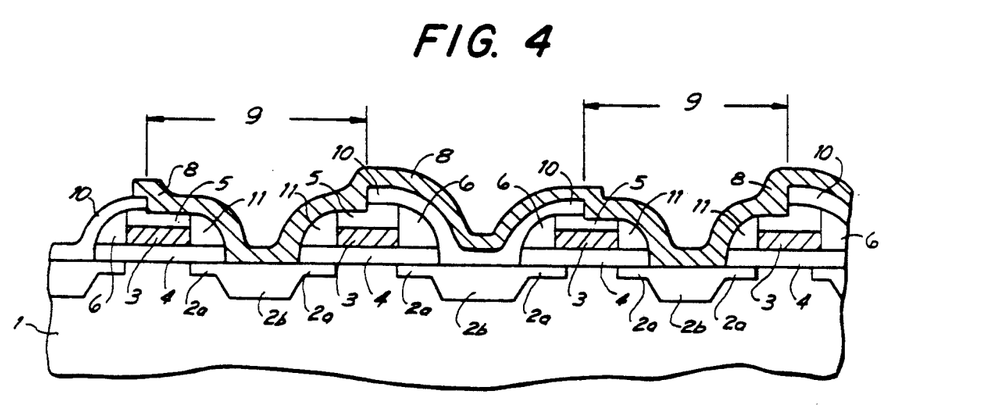
FIG. 4 is a sectional view of the main part of an embodiment of a semiconductor device according to the present invention.
Figure 5:
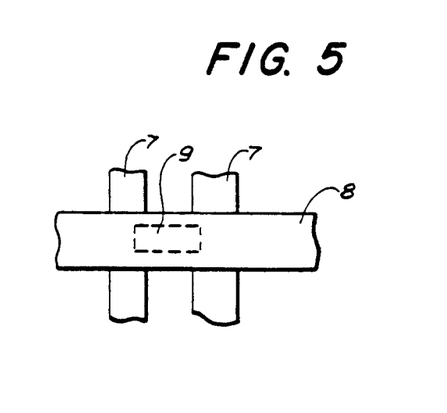
FIG. 5 is a plan view of the contact portion of the embodiment shown in FIG. 4.

FIGS. 4 and 5 are respectively explanatory views of a semiconductor device according to the present invention and the contact portion thereof.

In FIGS. 4 and 5, the same numbers are provided for the same elements as those shown in FIGS. 1 to 3(e), and repetitious explanation thereof will be omitted.

In FIG. 4, the substrate 1 consists of a P$^-$ type semiconductor substrate or a P$^-$ region formed on an N$^-$ type semiconductor substrate consisting of a single crystal of silicon, as in FIG. 1, and, together with the other elements, defines an IC. Diffusion layers 2 constitutes N$^+$ type source and drain regions. As before, there are provided a diffusion layer 2a having a low concentration and a diffusion layer 2b having a high concentration. A first wiring layer 3 is formed on the upper surface of the insulating film 4 so as to be mainly used as a gate electrode. The gate electrode 3 is composed of polycrystalline silicon, a high-melting metal such as Mo, W, Ti and Pt, a silicide of a high-melting metal such as MoSi$_2$, WSi$_2$, TiSi$_2$ or a polysilicide consisting of polycrystalline silicon with a silicide of a high-melting metal formed thereon, and the same will be applied to the gate electrode in the following embodiments.

An insulating film 4 is formed of SiO$_2$ obtained by the thermal oxidation of the substrate 1 and is provided on the substrate 1 so as to be mainly used as a gate insulating film. As before, there is provided an interlayer insulating film 5 of SiO$_2$, Si$_3$N$_4$ or the like. The film 5 is situated above the substrate 1 in such a manner as to cover the semiconductor device. Thus, the interlayer insulating film 5 serves mainly to electrically isolate the second wiring layer of Al, Al-Si, Al-Si-Cu or the same material as that of the first wiring layer 7(3). Therefore, the formation of the interlayer insulating film 5 is most important in the present invention and it will be explained in detail in an embodiment of a manufacturing method which will be described later. For the interlayer insulating film 5, an SiO$_2$ film formed by thermal oxidation or CVD (Chemical Vapor Deposition) and an Si$_3$N$_4$ film formed by CVD are used.

As before, an insulating side wall 6 of SiO$_2$, Si$_3$N$_4$ or the like is provided mainly on the gate insulating film 4 at both end portions of the gate electrode 3 of the first wiring layer. The side wall 6 is produced by anisotropic etching. The side wall 6 isolates a pair of semiconductor regions which are used as the drain region and the source region. Such isolation serves to assure a sufficient effective channel length and insures that the diffusion layer 2a which is formed at this time, shall have a low concentration. An interlayer insulating film 10 of SiO$_2$, Si$_3$N$_4$ or the like between the first wiring layer 7(3) and the second wiring layer 8. A side wall insulating film 11 of SiO$_2$, Si$_3$N$_4$ or the like is provided on the gate insulating film 4 by anisotropic etching so as to insulate the side wall of the gate electrode 3 within the opening at which the second wiring layer 8 comes into contact with the diffusion layer 2 in the substrate. The side wall insulating film 11 assumes three different states depending on the thickness of the interlayer insulating film 10 and the length of the over etching time for etching the interlayer insulating film 10. The first state is as a side wall of an LDD structure; the second state is as a side wall insulating film which is formed by the same mechanism as the side wall itself when the interlayer insulating film 10 is anisotropically etched to form the opening portion (represented by the numeral 9 in FIG. 5), and the third state is a side wall insulating film which is formed by a combination of the first state and the second state.

More specifically, when the overetching time is long, the entire part of the interlayer insulating film 10 is etched even on the side surface of the gate electrode 3, so that the side wall insulating film 11 becomes the side wall of an LDD structure (the first state). On the other hand, if the etching amount is reduced, the side wall insulating film 11 assumes the third state. The side wall insulating film 11 assumes the second state when a semiconductor device is fabricated by the process shown in the later-described third embodiment.

The semiconductor device according to the present invention is different from a conventional semiconductor device in the following points, as shown in FIGS. 4 and 5.

(1) The second wiring layer 8 is separated from the first wiring layer 7 (gate electrode 3) by the side wall 11, as if by self-alignment at that portion on the substrate 1 at which the second wiring layer 8 comes into contact with the diffusion layer 2.

(2) Since the opening portion 9 is wider than the width of the diffusion layer 2a, 2b of the source or drain region and the side wall 11, as shown in FIG. 5, no alignment allowance a is provided. Although the alignment allowance a can be eliminated in the stage of pattern layout, an alignment deviation exists between the first wiring layer 7(3) and the opening portion 9 at the time of photolithograph. Such an alignment deviation reduces the substantial contact area between the second wiring layer 8 and the diffusion layer 2 in the opening portion 9 and thereby increases the contact resistance. To eliminate this inconvenience, the opening portion 9 is provided in such a manner as to extend to a position above the first wiring layers 7 and 3, to a width greater than that of the underlying diffusion layer region.

(3) The first wiring layers 7 and 3 and the second wiring layer 8 are separated by the insulating film 5 as well as by the conventional interlayer insulating film 10. The semiconductor device of FIG. 4 can therefore be viewed as including semiconductor substrate 1, first insulating film carried on semiconductor substrate 1, first wiring layer 3 and interlayer insulating film 5, 6, 11 which overlies first wiring layer 3 and first insulating film 4. The insulator insulating film has top portion 5, which overlies first wiring layer 3, and a pair of sidewall portions 6, 11 which overlie first insulating film 4, are adjacent to the sides of first wiring layer 3 and, as viewed elevationally, increase in width in advancing from contact with first wiring layer 3 towards substrate 1. Second wiring layer 8 extends from overlying part of top portion 5 of the interlayer insulating film to and in contact with an exposed portion of substrate 1 adjacent first insulating film 4. Second wiring layer 8 also comes into contact with sidewall portion 11.

SECOND EMBODIMENT

An embodiment of a method of manufacturing a semiconductor device according to the present invention will be described with reference to FIGS. 6(a) to 6(l).

In these drawings, the reference numeral 12, 13 represents a photoresist pattern.

The manufacturing method of this embodiment comprises the following twelve steps.

Figure 6A:
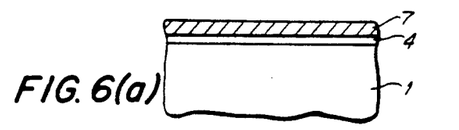
FIGS. 6(a) to 6(l), 7(a) to 7(c), 8(a) to 8(c), 9(a) to 9(d) are respectively explanatory views of embodiments of a manufacturing method according to the present invention.

(1) The gate insulating film 4 is first formed on the surface of a P$^-$ type semiconductor substrate 1. Thereafter a gate electrode layer 7 is formed on the gate insulating film 4, as shown in FIG. 6(a). The layer 7 consists of a polycrystalline silicon layer, a layer of a high-melting metal such as Mo, W, Ti and Pt, a layer of a silicide of a high-melting metal such as $MoSi_2$, $WSi_2$ and $TiSi_2$, or a polysilicide layer consisting of a combination of two layers thereof.

Figure 6B:
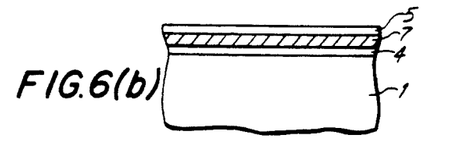

(2) The insulating film 5 of $SiO^2$, $Si_3N_4$ or the like is next formed on the gate electrode layer 7 by CVD, as shown in FIG. 6(b). In this case, the film of $SiO_2$ or $Si_3N_4$ or the like may be formed by the thermal oxidation, nitriding or the like of a part of the gate electrode layer 7.

Figure 6C:
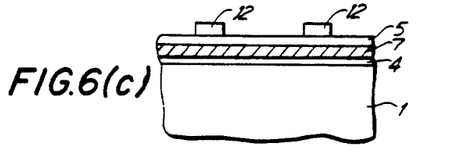

(3) The photoresist pattern 12 is formed on the insulating film 5, as shown in FIG. 6(c).

Figure 6D:
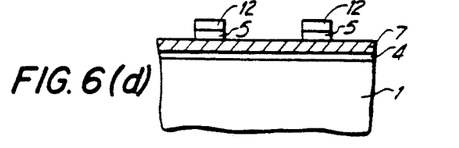

(4) The insulating film 5 is removed by reactive ion etching (RIE), as shown in FIG. 6(d).

Figure 6E:
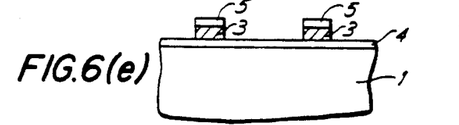

(5) The gate electrode 3 is then formed by reactive ion etching, as shown in FIG. 6(e), and the photoresist pattern 12 is removed, thereby selectively forming the insulating film 5 on the gate electrode 3.

Figure 6F:
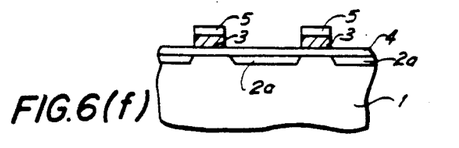

(6) An n$^-$ layer (diffusion layer 2a having a low concentration) is formed on the substrate 1 by the implantation of $^{31}P^+$ or $^{75}As^+$ ions while using the gate electrode 3 and the insulating film 5 as a mask, as shown in FIG. 6(f).

Figure 6G:
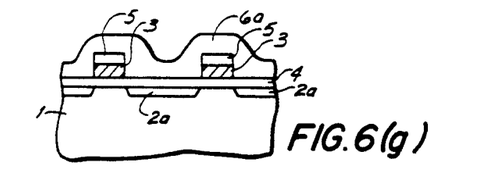

(7) The interlayer insulating film 6a of $SiO_2$, $Si_3N_4$ or the like is formed over the entire surface of the gate electrode 3 by CVD, as shown in FIG. 6(g).

Figure 6H:
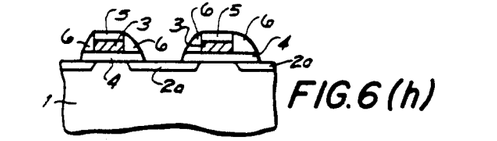

(8) The entire surface of the layer insulating film 6a is removed by reactive ion etching so as to form the sidewall 6 of $SiO_2$, $Si_3N_4$ or the like on the side wall of the gate electrode 3, as shown in FIG. 6(h).

Figure 6I:
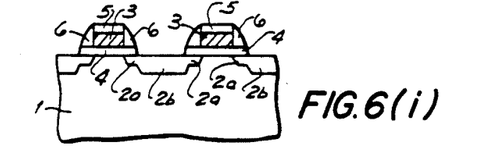

(9) An n$^+$ layer (diffusion layer 2b having a high concentration) is formed on the substrate 1 by the implantation of $^{31}P^+$ or $^{75}As^+$ ions, as shown in FIG. 6(i).

Figure 6J:
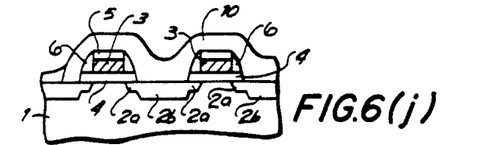

(10) The interlayer insulating film 10 of $SiO_2$, $Si_3N_4$ or the like is formed by CVD, as shown in FIG. 6(j).

Figure 6K:
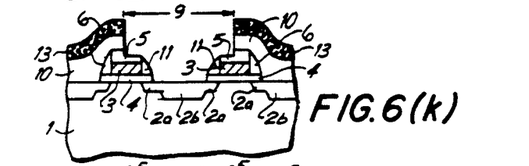

(11) A part of the interlayer insulating film 5 and a part of the side wall 6 underlying a portion of the interlayer insulating film 10 are removed. Removal is by etching so as to form the side wall 11 and the opening portion 9 at the contact portion while using a photoresist pattern 13 as a mask, as shown in FIG. 6(k).

At this time optimizations are effected, namely optimization of the thickness of the insulating film 5, optimization of the amount of overetching of the interlayer insulating film 6a when the side wall 6 is formed and optimization of the etching condition of the interlayer insulating film 10 for forming the opening portion 9 at the contact portion. The objective of the optimizations is to adjust the thickness of the interlayer insulating film 5 or 11 between the first wiring layer 7 and 3 and the second wiring layer 8 to not less than 500 Å at the thinnest portion, whereby the leakage between the first wiring layers 7 and 3 and the second wiring layer 8 is prevented and adequate breakdown voltage value is assured.

Figure 6L:
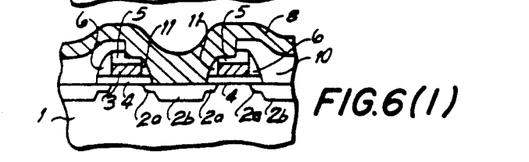

(12) Finally, the second wiring layer 8 is formed from a film of Al, an Al alloy such as Al, Al-Si and Al-Si-Cu or the same material as that of the first wiring layer 7, 3 by a conventional method, as shown in FIG. 6(l).

A semiconductor device having the structure in accordance with the present invention was produced by executing the above-described twelve steps.

THIRD EMBODIMENT

Figure 7A:
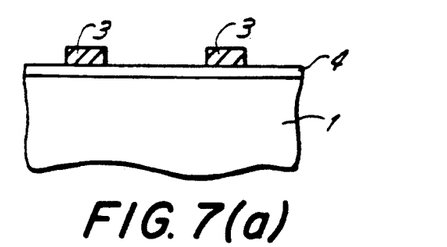

Another embodiment of a manufacturing method of the present invention will be described with reference to FIGS. 7(a) to 7(c).

(1) The gate insulating film 4 is first formed on the surface of a P$^-$ type semiconductor substrate 1. Thereafter the gate electrode 3 is formed on the gate insulating film 4 on substrate 1, as shown in FIG. 7(a). The gate electrode 3 consists of a polycrystalline silicon layer, a high-melting metal layer such as Mo, W, Ti and Pt, a layer of silicide of high-melting metal such as $MoSi_2$, $WSi_2$ and $TiSi_2$ or a polysicilide layer consisting of combination of two layers thereof.

Figure 7B:
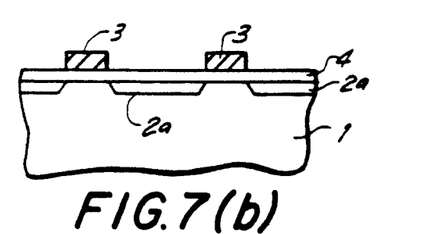
Figure 7C:
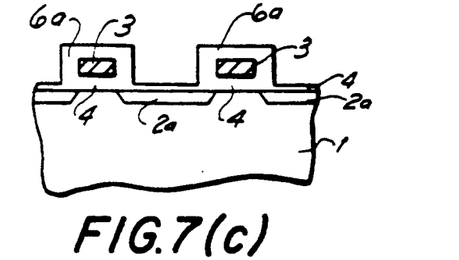

(2) An n$^-$ layer (diffusion layer 2a having a low concentration) is formed on the substrate 1 by the implantation of $^{31}P^+$ or $^{75}As^+$ ions while using the gate electrode 3 as a mask, as shown in FIG. 7(b).

(3) The thus-treated substrate 1 is subjected to oxidization at a temperature of not higher than 950° C. in a wet atmosphere so as to form an interlayer insulating film 6a of considerably greater oxidation film thickness around the gate electrode 3 than on the gate insulating film 4. The thickness is variable, depending on the temperature condition, but in a range of about 5 to 10 times more, as shown in FIG. 7(c).

(4) The seven steps (6) to (12) in the second embodiment are executed, as shown in FIG. 6(f) to 6(l).

A semiconductor device having the structure in accordance with the present invention was produced by the method including the above-described twelve steps.

FOURTH EMBODIMENT

Figure 8A:
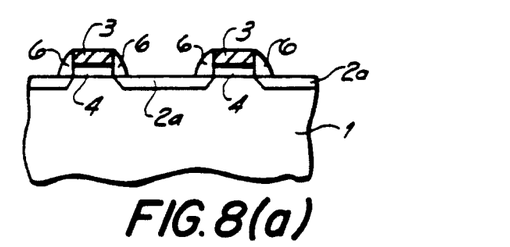

Still another embodiment of a manufacturing method of the present invention will be explained with reference to FIGS. 8(a) to 8(c).

(1) The gate insulating film 4 is first formed on the surface of a P$^-$ type semiconductor substrate 1 by a conventional method. Thereafter the gate electrode 3 is formed on the gate insulating film 4 on substrate 1. The gate electrode 3 consists of a polycrystalline silicon layer, a high-melting metal layer such as Mo, W, Ti and Pt, a layer of silicide of high-melting metal such as $MoSi_2$, $WSi_2$ and $TiSi_2$ or a polysilicide layer consisting of a combination of two layers thereof. An n$^-$ layer (diffusion layer 2a having a low concentration) is formed on the substrate 1 by implantation of $^{31}P^+$ or $^{75}As^+$ ions while using the gate electrode 3 as a mask. The side wall 6 is formed on the side surface of the gate electrode 3, as shown in FIG. 8(a).

Figure 8B:
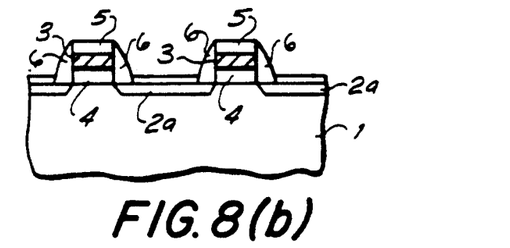

(2) The thus-treated substrate 1 is subjected to oxidation at temperature of not higher than 950° C. in a wet atmosphere so as to form the insulating film 5 of $SiO_2$, as shown in FIG. 8(b). In the same way as in the step (3) in the third embodiment, the insulating film 5 formed over the gate electrode 3 has greater volume of oxidation film thickness than that on the Si substrate 1.

Figure 8C:
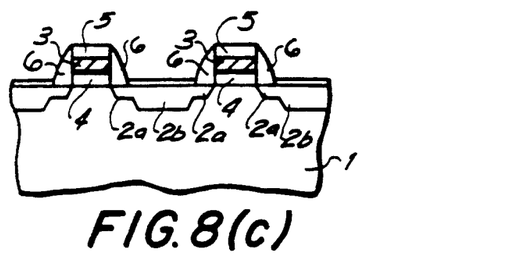

(3) An n+ layer (diffusion layer 2b having a high concentration) is formed on the substrate 1 by the implantation of $^{31}P^+$ or $^{75}As^+$ ions, as shown in FIG. 8(c).

(4) The three steps (10) to (12) in the second embodiment are executed, as shown in FIG. 6(j) to 6(l).

A semiconductor device having the structure in accordance with the present invention was produced by the method consisting of the above-described six steps.

The manufacturing method of the present invention is different from the conventional manufacturing method in the following points:

(1) The insulating film 5 is formed to a predetermined thickness on the first wiring layer 7 and 3 before forming the side wall 6 in the second and third embodiments, or at least before forming the interlayer insulating film 10 after the formation of the side wall 6 in the fourth embodiment.

(2) When the side wall 6 is formed and the interlayer insulating film 10 is etched in the second and third embodiments, or when the interlayer insulating film 10 is etched in the fourth embodiment, etching is carried out so as to leave a final thickness of the insulating film 5 of not less than 500 Å on the first wiring layers 7 and 3.

Although the n channel transistor formed on the P− substrate is described in the above-described embodiments, it goes without saying that the present invention is applicable to a P channel transistor formed on a n type substrate or an n− well in P type substrate and N channel transistor formed on a P− well in N type substrate.

Use of the structure of a semiconductor device according to the present invention brings about the following advantages:

(1) Since it is possible to dispense with provisions of the alignment allowance, the interval of the wires of the first wiring layer is reduced, thereby realizing a semiconductor device of a higher density.

(2) Since it is possible to shorten the wiring length of the second layer, the wiring resistance and hence, the wiring delay are reduced.

(3) Since the area of the diffusion layer is reduced, the capacitance of the diffusion layer is reduced and the parasitic capacitance of the second layer is thereby reduced, which leads to realization of speed-up of operation.

(4) The total area of a chip is reduced, thereby increasing the number of effective chips in a wafer, resulting in reduction in cost.

Thus, the semiconductor device according to the present invention is very effective, particularly, for speed-up of operation and reduction in cost.

Quantitatively speaking, in the above-described example the length of one side of a cell portion for a 1 M bit mask ROM (Read Only Memory) was reduced by as much as $(3.2-1.2)$ μm×1000=2000 μm. This effect enabled reduction in chip area and also reduction in the area of the ROM portion in a integrated circuit containing the ROM. As is well known, in a ROM arrangement, a ROM mask is used to write data to the memory cell which is composed of MOS transistors. The ROM mask is a photoetching mask which is utilized in the manufacturing process.

FIFTH EMBODIMENT

A method of manufacturing a MOS semiconductor device according to the present invention will be explained with reference to FIGS. 9(a) to 9(d).

Figure 9A:
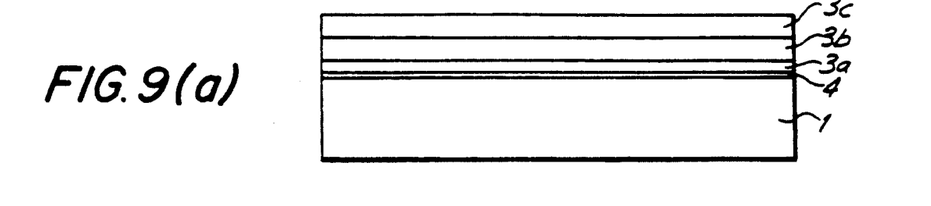

The gate insulating film 4 of 400 Å thick was first formed on the P− type silicon substrate 1 having a resistivity of 8 to 12 ohm-cm at 1000° C. in an $O_2$ atmosphere. Thereafter, a first polycrystalline silicon layer 3a was deposited to a thickness of 1000 Å, then a molybdenum silicide layer 3b (hereinunder referred to as "$MoSi_2$ layer") was deposited to a thickness of 2,000 Å by sputtering, and a second polycrystalline silicon layer 3c was subsequently deposited to a thickness of 2,000 Å by CVD. These layer depositions were for the purpose of forming the gate electrode 3, as shown in FIG. 9(a). It is also possible to use an $MoSi_2$ layer of 3,000 Å thick with a polycrystalline silicon layer of 2,000 Å thick formed thereon as the gate electrode 3. In other words, a certain conductor with a polycrystalline silicon layer formed thereon is usable as the gate electrode.

Figure 9B:
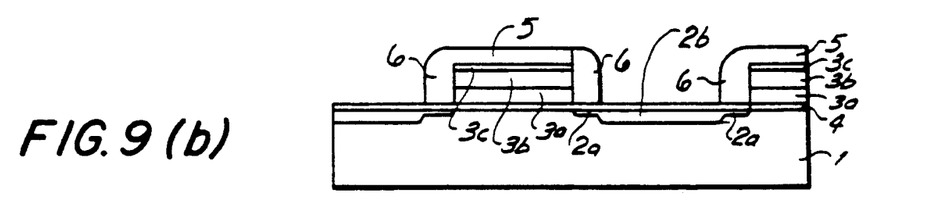

A desired patterning was then carried out by photolithography using a positive resist, and the second polycrystalline silicon layer 3c, the $MoSi_2$ layer 3b and the first polycrystalline silicon layer 3a were successively dry etched in that order, as shown in FIG. 9(b). The first polycrystalline silicon layer was etched for about 30 seconds in $SF_6$ and $CClF_5$ gas atmosphere under a pressure of 0.6 Torr at 150 W. The etching time for the second polycrystalline silicon layer 3c was about 20 seconds. The $MoSi_2$ layer 3b was etched for about 1 minute in a CCl +$O_2$ gas atmosphere under a pressure of 6 Pa at 200 W.

Ionized phosphorus P+ was then implanted at a dosage of $8 \times 10^{12}$ ions/$cm^2$ at an acceleration energy of 30 Kev to form to an N− layer (diffusion layer 2a having a low concentration) while using the gate electrode 3 as a mask.

The thus-treated substrate 1 was further subjected to oxidation for 30 minutes in a wet $O_2$ atmosphere at 950° C. The oxidation changed the sputtered $MoSi_2$ layer 3b in to a silicide layer and formed a silicon oxide layer 5 of about 2,500 Å on the second polycrystalline silicon layer 3c from part of the second polycrystalline silicon layer 3c. At this time, a silicon oxide layer of 500 Å was also formed on the silicon substrate 1 by thermal oxidation. The isolation voltage of the silicon oxide layer formed by the oxidation of the $MoSi_2$ layer 3b was about 3 mv/cm, but the silicon oxide layer 5 formed over the $MoSi_2$ layer 3b by the oxidation of the second polycrystalline silicon layer 3c was dense and had an insulation voltage of not less than 6 to 8 mv/cm.

A second silicon oxide layer was next deposited to thickness of 5,000 Å by CVD. The CVD was carried out by 30-minute heat treatment in an $N_2O+CH_4$ and $N_2$ gaseous atmosphere at 780° C. under a pressure of 200 Pa.

The second silicon oxide layer was dry etched in an RIE mode (Reactive Ion Etching). At this time, the second silicon oxide layer remained at the side wall portion of the first polycrystalline silicon layer 3a, at the $MoSi_2$ layer 3b, at the second polycrystalline silicon layer 3c, and at the first silicon oxide layer, thereby forming the side wall 6. The dry etching had reduced the thickness of the oxide film 5 on the second polycrystalline silicon layer 3c to about 2,000 Å. In this way, by the end of this step, the first polycrystalline silicon layer 3a, the $MoSi_2$ layer 3b and the second polycrystalline silicon layer 3c had been completely covered with the silicon oxide film. Ionized phosphorus P+ was then implanted at a dosage of $1 \times 10^{16}$ ions/cm$^2$ at an acceleration energy of 30 KeV to form the diffusion layer 2b which is to be a source region and/or a drain region. The diffusion layer 2a under the portion 6 was formed before the formation of the portion 6, as shown in FIG. 9(b).

Figure 9C:
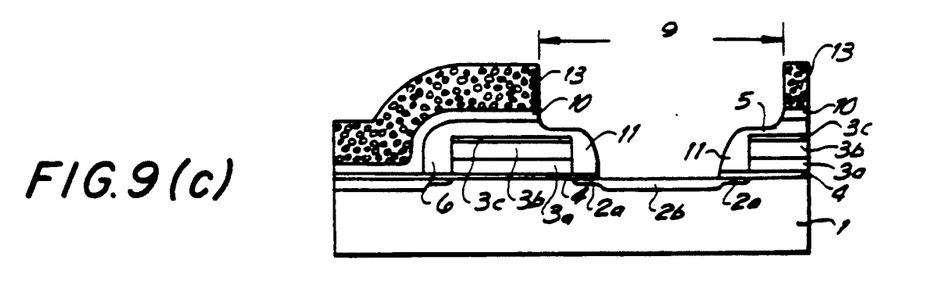

A third silicon oxide film 10 was deposited to a thickness of 2,500 Å by CVD at 760° C. under a pressure of 200 Pa by using SiH$_4$, N$_2$O and N$_2$ gases, as shown in FIG. 9(c).

Figure 9D:
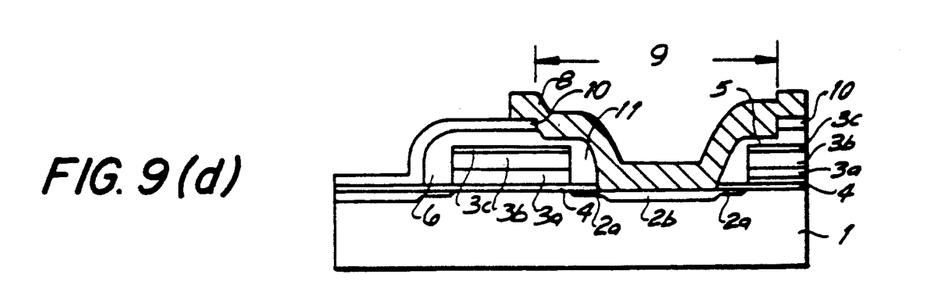

The portion which needs to contact with the Si substrate 1 was opened while using the positive resist pattern 13 as a mask (the opening portion is called a through hole 9). The portion to be opened may overlap with the pattern of first polycrystalline silicon layer 3a, MoSi$_2$ layer 3b and second polycrystalline silicon layer 3c, as shown in FIG. 9(d). About 1 µm of each alignment allowance between through hole 9 and first polycrystalline silicon 3a, MoSi layer 3b, and second polycrystalline silicon 3c is necessary in the prior art. In the above-described method as per the present invention, which allows the overlapping of the through hole with first polycrystalline silicon layer 3a, MoSi2 layer 3b and second polycrystalline silicon layer 3c, further miniaturization of the element is enabled.

Third silicon oxide film 10 was next partially opened by dry etching in a C$_2$ ClF$^5$ and N$_2$ gas atmosphere under a pressure of 0.12 Torr at 600 W.

Silicon substrate 1 was exposed by etching, as shown in FIG. 9(d). Since the oxide film formed on the second polycrystalline silicon layer 3c had been etched only to the depth of 500 Å, the oxide film of 1,500 Å thick still remained on the second polycrystalline silicon layer 3c.

Second wiring layer 8 including a third polycrystalline silicon layer or the like was further deposited thereon to a thickness of 2,000 Å. After ionized phosphorus P+ was implanted at a dosage of $6 \times 10^{15}$ ions/cm$_2$, a desired patterning was carried out by photolithography using a positive resist. The thus-treated substrate 1 was then dry etched for about 20 seconds in a C$_2$ClF$_5$+SF$_6$ gas atmosphere under a pressure of 0.6 Torr at 150 W to form second wiring layer 8.

Thereafter silicon oxide was deposited in order to insulate the third polycrystalline layer and the wiring material. An opening for keeping contact with the silicon substrate, the second polycrystalline silicon layer and the third polycrystalline silicon layer were formed. A wiring material was deposited in the opening, and all over the substrate and after patterning of wiring material, a device surface protecting film was deposited. Finally, an opening for keeping contact between the wiring material and an external terminal was opened.

Although a part of the uppermost polycrystalline silicon layer 3c of the gate electrode 3 was oxidized to form an SiO$_2$ film in this embodiment, the following method may be adopted in place of this oxidation method:

The first polycrystalline silicon layer 3a is deposited on the gate insulating film 4 to a thickness of 1,000 Å, and subsequently the MOSi$_2$ layer 3b is formed as 2,000 Å thick, then second polycrystaline silicon layer 3c is formed as 500 Å thick and then first silicon oxide layer 5 is formed as 3,000 Å thick by CVD. The same effect is obtained by using WSi$_2$, TiSi$_2$, Mo, W, Ti or Pt in place of MoSi$_2$. It is also possible to use another Al, Al-Si, Al-Si-Cu high melting metal or a silicide of a high-melting metal for the second wiring layer 8 in place of polycrystalline silicon.

As described above, according to this embodiment, the insulation voltage between gate electrode 3 (including first polycrystalline silicon layer 3a, MoSi$_2$ layer 3b and second polycrystalline silicon layer 3c) on the one hand, and second wiring layer 8 (including for example, the third polycrystalline silicon layer) on the other hand, was improved to not less than 8 mv/cm, thereby greatly enhancing the reliability.

The 4 M bit mask ROM fabricated from the MOS semiconductor device of this embodiment had a chip area 20% smaller than that of a conventional one.

SIXTH EMBODIMENT

Figure 10:
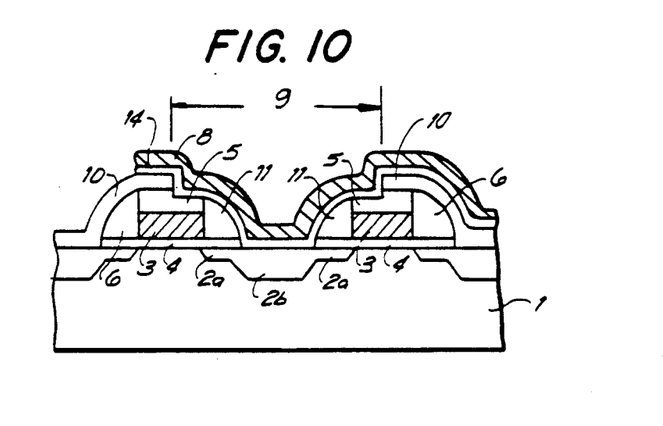
FIG. 10 is a schematic view of another embodiment of a semiconductor device of the present invention.
Figure 11A:
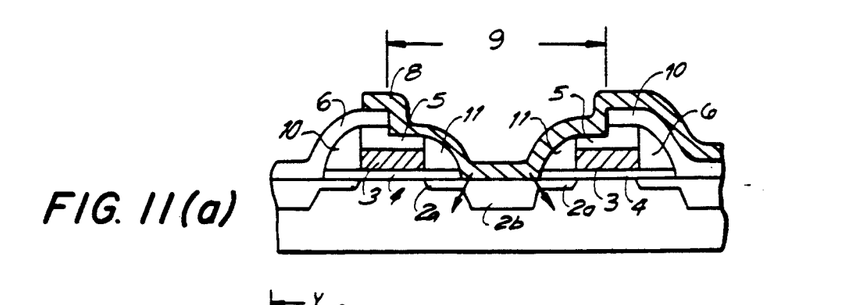
FIGS. 11(a) to 11(c) are explanatory views of leakage caused between a second wiring layer and a substrate.
Figure 11B:
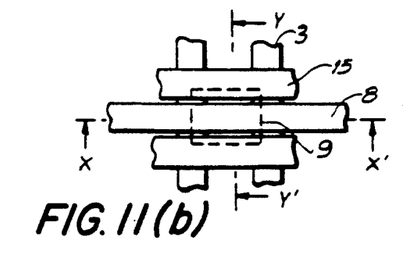
Figure 11C:
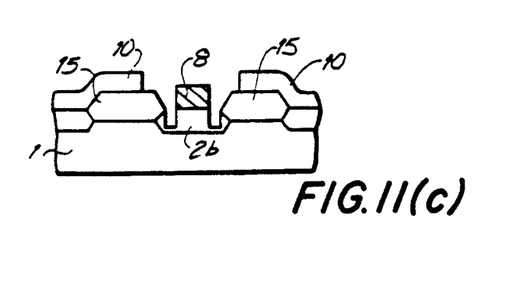

In the first to fifth embodiments, when the second wiring layer 8 includes a metal such as Al, which is susceptible at low temperatures to reaction with the silicon of substrate 1, the danger of heat treatment causing leakage between second wiring layer 8 and substrate 1 exists. The leakage path would be through diffusion layer 2a or the boundary between diffusion layers 2a and 2b, as indicated by the arrows in FIG. 11(a). This sixth embodiment is characterized in that a conductive layer 14 is provided, as shown in FIG. 10, so as to eliminate such a danger. FIGS. 11(a) to 11(c) are explanatory views of the leakage caused between the second wiring layer and the substrate, wherein FIG. 11(a) is a sectional view of FIG. 11(b), taken along the line X-X' of FIG. 11(b) and FIG. 11(c) is a sectional view of FIG. 11(b) taken along the line Y-Y' of FIG. 11(b).

Conductive layer 14 consists of a high-melting metal such as Mo, W, Ti and Pt, a silicide thereof, a nitride thereof or a combination of at least two layers thereof. Conductive layer 14 is formed at least at the portion of a substrate at which second wiring layer 8 comes into contact with the silicon substrate 1. Conductive layer 14 is formed on the entire undersurface of the second wiring layer 8.

Conductive layer 14 both prevents the second wiring layer 8 from communicating with substrate 1 and lowers the contact resistance between second wiring layer 8 and substrate 1.

When a material is used for conductive layer 14 having a large selectivity with respect to second wiring layer 8 at the time of etching, second wiring layer 8 includes polycrystalline silicon and conductive layer 14 includes MoSi$_2$, the undesirable effects associated with FIGS. 11(b) and 11(c) are avoided.

More specifically, according to this sixth embodiment, even when the wiring width of second wiring layer 8 is smaller than the width of the exposed surface of silicon substrate 1 at opening portion 9, silicon substrate 1 will not be etched when second wiring layer 8 is etched. Etching of the substrate would result in the formation of a groove which might break the wire formed thereon, as shown in FIGS. 11(b) and 11(c). A device isolation region 15 is provided to avoid such breakage.

Conductive layer 14 is formed by including the following step after the step shown in FIG. 6(k), thereby obtaining the structure shown in FIG. 10.

Conductive layer 14 or multi-layer conductive layer 14 consists of a high-melting metal such as Mo, W, Ti and Pt, a silicide thereof, a nitride thereof or a combination of at least two layers thereof is formed by sputtering or CVD and the second wiring layer 8 is formed thereon.

In order to form conductive layer 14 on the entire undersurface of second wiring layer 8, conductive layer 14 and second wiring layer 8 are consecutively formed. After forming a photoresist pattern, second wiring layer 8 and the conductive layer 14 are etched either simultaneously or at two stages. At this time, the resistance to electromigration is simultaneously achieved.

On the other hand, in order to form conductive layer 14 only between second wiring layer 8 and the Si surface of diffusion layer 2, conductive layer 14 is first formed on the entire surface in the state shown in FIG. 6(k), and only the silicon surface is changed into a silicide by heat treatment and then selectively etched by using Ti or the like so as to form the silicide film only on the Si surface. In order to form conductive layer 14 only in the vicinity of the portion between the second wiring layer 8 and the Si surface of diffusion layer 2, after the conductive layer 14 is formed on the entire surface in the state shown in FIG. 6(k), a photoresist pattern is formed only at the necessary portion. After conductive layer 14 is etched and the photoresist pattern is removed, second wiring layer 8 is formed by a conventional method.

A mask ROM and an integrated circuit containing the mask ROM were produced using this embodiment.

Mask ROMs and integrated circuits containing the mask ROMs are preferred applications of the several embodiments hereinbefore described. However, the invention may be advantageously practiced in other applications, for example in integrated circuit applications in general, and particularly in large scale IC applications, where some of the aforedescribed advantages may be utilized to great effect. These advantages are reduction in wiring length and wiring materials, and hence in wiring resistance, reduction in parasitic capacitance, reduction in chip area, speed-up of operation, and reduction in cost.

To achieve the objects of the invention, opening portion 9 in a semiconductor device according to the present invention is provided in such a manner as to extend to a position above first wiring layers 7 and 3 so as to make an allowance for the alignment deviation and prevent the increase in the contact resistance.

In a conventional method, the interval of first wiring layers of 7 and 3 polysilicon or the like is $1+2a$, as shown in FIG. 2 wherein l represents the width of the opening portion between first wiring layers 7 and 3 of polysilicon or the like and a is the alignment allowance.

In the method of the present invention, however, no alignment allowance is necessary, and the wiring interval may be minimized restricted only by fabrication necessity, as shown in FIG. 5.

If it is assumed that the width of the first wiring layer 7, 3 of polysilicon or the like is 1.2 μm, the interval of the wires is 1.2 μm, the alignment allowance a is 1.0 μm and l is 1.2 μm, the wiring interval width is $$l+2a=(1.2+1.0\times2)\mu m=3.2\ \mu m$$

by a conventional method; and 1.2 μm by the method of the present invention. Thus, according to the present invention, the wiring interval is reduced to less than half that realized by a conventional method.

SEVENTH EMBODIMENT

Figure 12:
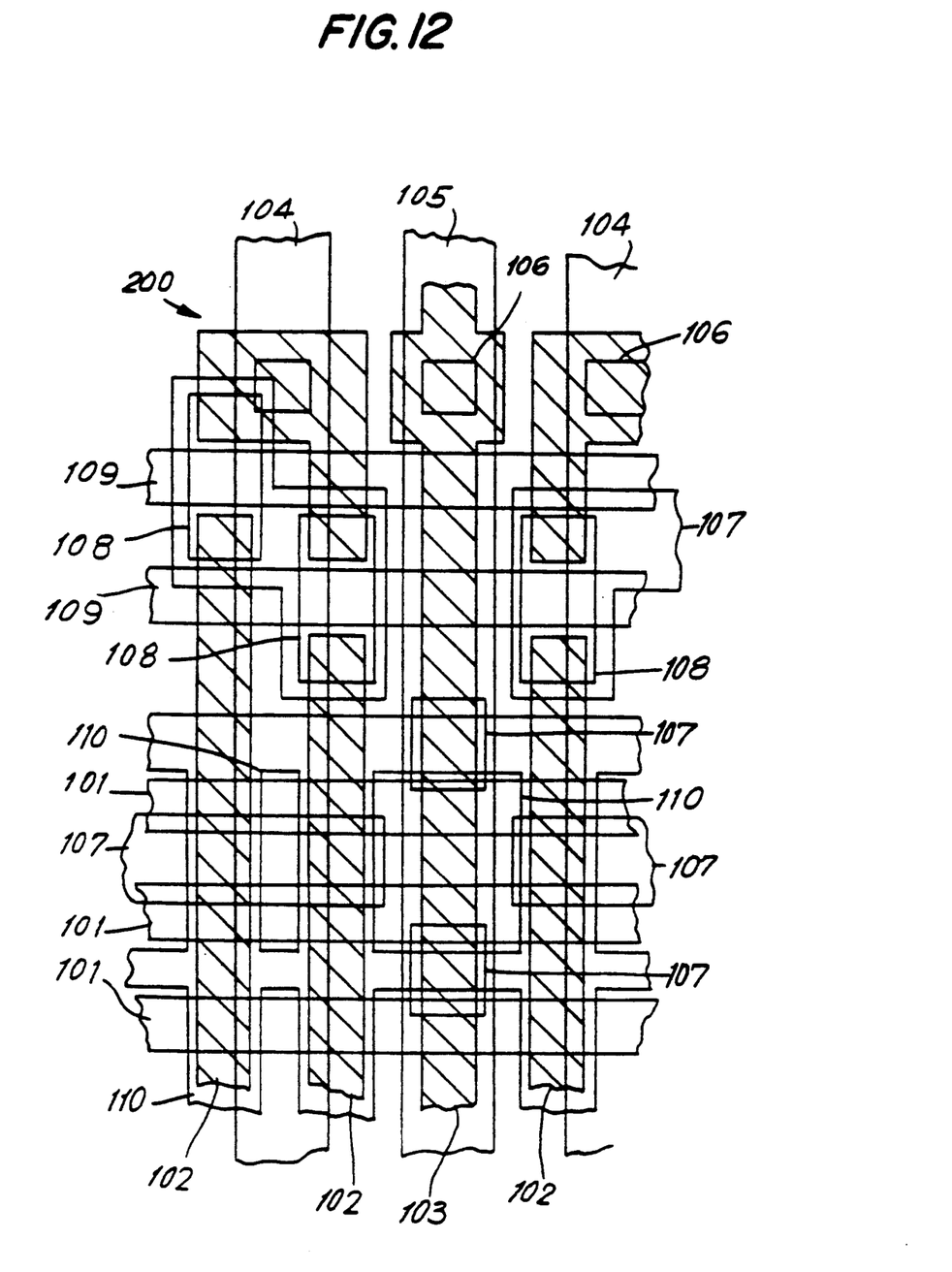
FIG. 12 is a partial, cutaway plan view of a portion of a semiconductor memory device in accordance with another embodiment of the invention.

Reference is now made to FIG. 12 wherein a semiconductor memory device, generally indicated as 200, constructed in accordance with another embodiment of the invention is depicted. FIG. 12 is a generally plan view. However, elements which are covered by other elements are shown with solid lines, relative vertical positioning being shown in FIG. 13. A first bit line 102 is formed as polycrystalline silicon. A word line 1 also forms the gate electrodes of the MOS transistors which make up semiconductor memory device 200.

First bit line 102, which is formed of polycrystalline silicon, is adapted to have impurities diffused therein. A first source line 103 is also formed of polycrystalline silicon. First source line 103 is connected to the source electrodes of the MOS transistors. The MOS transistors are the memory cells. The polycrystalline silicon first source line 103 also has an impurity diffused to form the source electrode. A second bit line 104 is formed of metal, generally aluminum. A second source line 105 adapted to be connected to the source electrodes of the MOS transistors through first source line 103 is formed of a metal, such as aluminum. A contact hole 106 connects the polycrystalline silicon of first source line 103 to the metal of second source line 105. Contact holes 107 are for connecting the polycrystalline silicon of first bit lines 102 to the diffusion layer 110 which is the drain of the MOS transistor by a buried contact as described below in greater detail. A difference of the oxide film 108 is used to form the selection circuit for selecting which of the first bit lines 102 will be connected to the second bit line 104. Gate electrodes 109 are the selection lines for the first bit lines.

Figure 13:
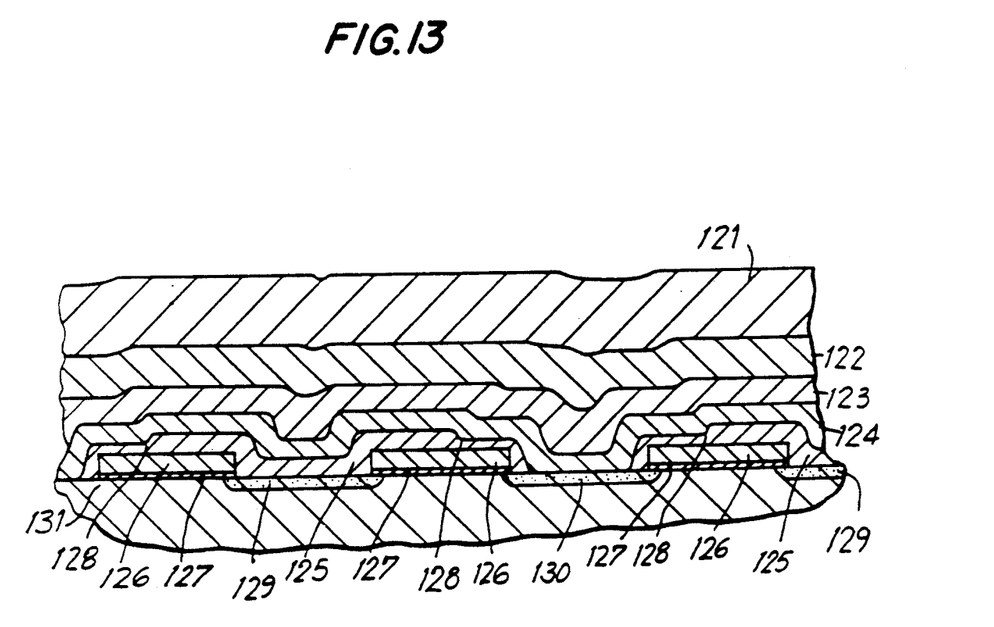
FIG. 13 is a cutaway sectional view of the memory cells of FIG. 12.

Reference is next made to FIG. 13 wherein a sectional view of a small portion of the memory cells of semiconductor memory device 200 is depicted. A passivation film 121 which reduces coaction of the semiconductor memory device with outside influences such as electrical circuit and light rests on top of the other layers. Directly underneath passivation film 121 is a metal wiring layer 122. Metal wiring layer 122 includes at different locations second bit line 104 and second source line 105. The locations of second bit lines 104 and second source line 105 are patterned and etched. Underneath metal wiring layer 122 is an insulating film layer 123 between metal wiring layer 222 and a polycrystalline silicon wiring layer 124. Polycrystalline silicon wiring layer 124 includes first bit line 102 and first source line 103. While layers 122 and 124 are shown as continuous layers at this section, the shapes of the layers are controlled by the masks and photoetching processes involved in patterning the semiconductor and metal layers. In addition, there are contact points between the second bit line 104 and second source line 105 of layer 122 and the first bit line 102 and first source line 103 of layer 124 through layer 123 as shown in FIG. 12.

An insulating film layer 125 separates polycrystalline silicon layer 124 and gate electrodes 126. A gate oxide film 127 separates gate electrodes 126 from diffusion layers 129 and 130 and silicon substrate 131. A difference of the hole 128, which results in insulating layer 125 protecting the side of gate electrodes 126 when a buried contact is made is shown between polycrystalline silicon layer 124 and diffusion region 130. The manner in which the difference in the hole 128 is formed is described below with respect to FIGS. 14(a), 14(b) and 14(c).

One method of forming a buried contact is briefly described, although other methods are applicable. After forming the oxide film for the MOS transistor, the gate oxide film is grown. Then, the material from which the gate electrode (and word line) is formed, e.g. polycrystalline silicon is grown over the entire substrate. Then, an oxide film is grown on top of this. Next, the photoetching of the gate electrode is performed and then the source and drain electrodes are formed by thermal diffusion or ion implantation. If the oxide film is grown all over the substrate, the gate electrode is thicker than the diffusion layer because the oxide film remains on the gate electrode. In this situation, photoetching of the oxide film over the diffusion region is performed with the same technology used for forming LDD (lightly doped drain) structure which is used for extremely miniaturized MOS transistor technology by leaving the oxide film on the side wall of the gate electrode. Then, polycrystalline silicon is grown on the hole which has been opened above the diffusion region and pattern forming is performed by photoetching. Thereafter, the layer insulating film, contact hole and metal are formed in the same order as in a standard MOS transistor's structure.

Figure 14A:
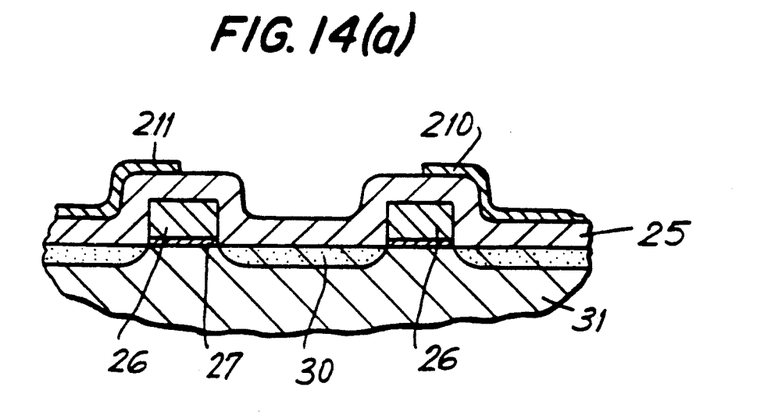
FIGS. 14(a), 14(b) and 14(c) are sequential sectional views showing the formation of buried contacts for the memory cells of FIG. 13.
Figure 14B:
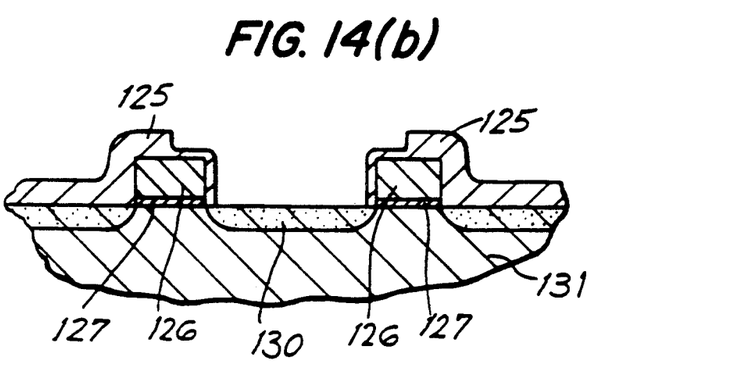

In FIGS. 14(a), 14(b) and 14(c), the method of forming the buried polycrystalline silicon contact with diffusion region 130 is shown. In FIG. 14(a), after a silicon dioxide insulating layer 125 is grown on gate electrode 126 and the silicon dioxide has grown all over the surface, masks 210, 211 are utilized. Then, as shown in FIG. 14(b), anisotropic etching is performed. As can be clearly seen the sides of gate electrodes 126 adjacent to the opened contact hole are still covered by a insulating layer 125. This protects the integrity of gate electrode 126, particularly in highly miniaturized transistor structures where destruction of the upper portion of the gate electrode is otherwise possible.

Figure 14C:
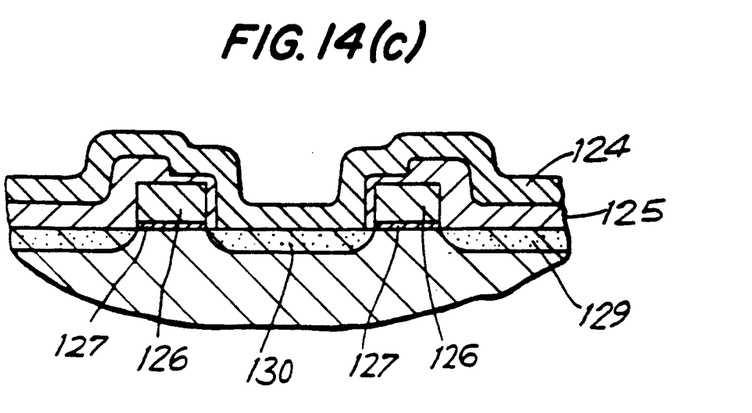

Finally, as shown in FIG. 14(c), polycrystalline silicon, which forms the first bit line (or first source line), is grown, forming a solid and accurate buried contact between diffusion layer 130 and polycrystalline silicon layer 124. A buried contact is thus formed in accordance with a self aligned method which avoids the need for enlargement of circuit elements beyond the predetermined design scale.

Thus, in the buried contact described above with respect to FIGS. 14(a), 14(b) and 14(c), a thick oxide film is grown on the gate electrode and the hole is formed by a self aligned method with respect to the gate electrode and diffusion layers while retaining bits of the oxide film on the side walls of the gate electrode while making a hole. As a result, additional alignment space between the gate electrode and diffusion layer is not needed. Thus, the pattern forming of the wiring layer of the gate electrodes, the diffusion layer and the polycrystalline silicon wiring line can be designed for minimum size.

A semiconductor device according to all embodiments of the present invention having the above-described structure can be made having a reduced chip area. Hence, reduction of the area of the diffusion layer for the source or drain electrodes is enabled. The latter reduction is in proportion to the reduction of the chip area, thereby reducing the parasitic capacitance. In the same way, the wiring length of a second layer is shortened in proportion to the reduction of the chip area, so that it is possible to reduce the wiring resistance and propagation delay. Thus, a semiconductor device according to the present invention can cope with the demand for speed-up of operation and reduction in costs.

In a semiconductor device according to the present invention, when polysilicon, a high-melting metal such as Mo, W, Ti and Pt, a silicide of a high-melting metal such as $MoSi_2$, $WSi_2$, and $TiSi_2$, or a polysilicide of two layers thereof is used for a gate electrode and first wiring layer, breakdown of an insulating layer is apt to be caused due to the uneven surface of such conductive layers. To prevent this, the thickness of the insulating film between the two A layers is set at not less than 500 Å at the thinnest portion.

To recapitulate quantitatively stated attributes of the inventive embodiments, it will be recalled that by practicing the present invention the wiring interval width of the inventive semiconductor device is reduced by better than 50% vis-a-vis that of the conventional device. In consequence, the length of one side of a cell portion of a mask ROM could be reduced by 2,000 μm; the chip area of a mask ROM by 20%.

Thus the semiconductor device according to the present invention is very effective, particularly for miniaturization, for speed-up of operation and for reduction in cost.

It will thus be seen that the objects set forth above, among those made apparent from the preceding description, are efficiently attained.

In the preceding description there have been indicated modifications and changes in the embodiments described in greater detail. For example, some of the method-of-manufacturing embodiments include changes in some of the steps, together with retention of other steps, of the second embodiment (described with reference to FIG. 6). Other disclosed changes pertain to the oxidation steps called for in the principal version of the fifth embodiment (FIG. 9). Still other suggested changes involve inversion of conductivity type (N to P and vice-versa) for the substrate and for the channel transistor. These and other changes may be made in carrying out the above constructions and methods without departing from the spirit and scope of the invention. Therefore it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

We claim:

1. A semiconductor device comprising:
   a semiconductor substrate;
   a first insulating film carried on the semiconductor substrate;
   a first wiring layer having sides and carried on the first insulating film;
   an interlayer insulating film overlying the first wiring layer and the first insulating film, the interlayer insulating film having:
   a top portion which overlies the first wiring layer, and
   a pair of sidewall portions which overlie the first insulating film, are adjacent to and in contact with the sides of the first wiring layer, and, as viewed from an elevational perspective, increase in width in advancing from contact with the first wiring layer towards the substrate; and
   a second wiring layer which extends from overlying part of the top portion of the interlayer insulating film to and in contact with an exposed portion of the substrate adjacent the first insulating film;

wherein a portion of the second wiring layer is in contact with a portion of at least one of the pair of sidewall portions.

2. The semiconductor device according to claim 1, wherein the first wiring layer comprises a layer of polycrystalline silicon.

3. The semiconductor device according to claim 1, further including diffusion-layer regions in the surface of the semiconductor substrate contacted by the first insulating film and defining a source region and a drain region.

4. The semiconductor device according to claim 2, further including diffusion-layer regions in the surface of the semiconductor substrate contacted by the first insulating film and defining a source region and a drain region.

5. The semiconductor device according to claim 1, wherein said first wiring layer serves as a gate electrode.

6. The semiconductor device according to claim 1, wherein the second wiring layer comprises a layer of polycrystalline silicon.

7. The semiconductor device according to claim 2, wherein the second wiring layer comprises a layer of polycrystalline silicon.

8. The semiconductor device according to claim 3, wherein the second wiring layer comprises a layer of polycrystalline silicon.

9. The semiconductor device according to claim 4, wherein the second wiring layer comprises a layer of polycrystalline silicon.

10. The semiconductor device according to claim 5, wherein the second wiring layer comprises a layer of polycrystalline silicon.

11. The semiconductor device according to claim 2, wherein said first wiring layer serves as a gate electrode.

12. The semiconductor device according to claim 11, wherein the second wiring layer comprises a layer of polycrystalline silicon.

13. The semiconductor device according to claim 3, wherein said first wiring layer serves as a gate electrode.

14. The semiconductor device according to claim 13, wherein the second wiring layer comprises a layer of polycrystalline silicon.

15. The semiconductor device according to claim 4, wherein said first wiring layer serves as a gate electrode.

16. The semiconductor device according to claim 15, wherein the second wiring layer comprises a layer polycrystalline silicon.

* * * * *